(12) United States Patent  (10) Patent No.: US 7,064,956 B2
Patel  (45) Date of Patent: Jun. 20, 2006

(54) COOLING SYSTEM FOR A DISPLAY PROJECTOR

(75) Inventor: Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 280 days.

(21) Appl. No.: 10/724,077

(22) Filed: Dec. 1, 2003

(65) Prior Publication Data

US 2005/0117295 A1   Jun. 2, 2005

(51) Int. Cl.
*H05K 7/20*  (2006.01)

(52) U.S. Cl. .................. 361/697; 361/688; 361/687; 353/54; 353/57; 353/61

(58) Field of Classification Search ............. 361/687, 361/689, 696, 697, 698, 699, 703, 707, 712; 353/57, 58, 60, 61, 119, 54; 359/820; 349/5, 349/58, 161
See application file for complete search history.

(56) References Cited

U.S. PATENT DOCUMENTS

| | | | |
|---|---|---|---|
| 4,660,132 A | | 4/1987 | Basler et al. |
| 4,925,295 A | * | 5/1990 | Ogawa et al. ............... 353/57 |
| 5,170,195 A | * | 12/1992 | Akiyama et al. ............. 353/54 |
| 5,738,427 A | | 4/1998 | Booth et al. |
| 6,115,251 A | | 9/2000 | Patel et al. |
| 6,418,017 B1 | | 7/2002 | Patel et al. |
| 6,462,804 B1 | * | 10/2002 | Yamada et al. ............. 349/161 |
| 6,588,907 B1 | | 7/2003 | Billington et al. |
| 6,709,115 B1 | * | 3/2004 | Chimura et al. ............ 353/119 |
| 6,739,831 B1 | * | 5/2004 | Hsu et al. .................... 415/60 |
| 6,742,899 B1 | * | 6/2004 | Wu et al. ..................... 353/61 |
| 6,844,993 B1 | * | 1/2005 | Fujimori et al. ............ 359/820 |
| 2002/0191159 A1 | * | 12/2002 | Nagao et al. ................. 353/54 |
| 2003/0066638 A1 | * | 4/2003 | Qu et al. .................... 165/186 |

FOREIGN PATENT DOCUMENTS

| | | | |
|---|---|---|---|
| JP | 401210187 A | * | 8/1989 |
| JP | 410239774 A | * | 9/1998 |
| JP | 02003075081 A | * | 3/2003 |

* cited by examiner

*Primary Examiner*—Michael V. Datskovskiy
(74) *Attorney, Agent, or Firm*—Richard P. Lange

(57) ABSTRACT

A cooling system for a display projector. The display projector has a plurality of panels substantially enclosing a heat generating component. The system includes means for conducting heat from the heat generating component to at least one panel of the housing and means for dissipating the conducted heat, wherein the means for dissipating comprises at least one panel of the display projector.

39 Claims, 5 Drawing Sheets

COOLING SYSTEM FOR A DISPLAY PROJECTOR

BACKGROUND OF THE INVENTION

Image display projectors generate display images and project them on to display screens for viewing by one or more viewers. The display images are formed and projected by passing light from a high-intensity light source through an image-forming medium such as a translucent film or liquid crystal display. Alternatively, the display images are formed through use of digital light processing which uses digital micromirror devices to form the display images. It is generally known that the high-intensity light source implemented in known image display projectors typically generates relatively large amounts of heat. In addition, as the high-intensity light sources become capable of greater light intensities, e.g., 2000 or more lumens, the amount of heat generated by these light sources have also increased.

Conventional image display projectors include fans to blow air over the light sources and lamp reflectors to cool them by forced convection. In this regard, conventional image display projectors typically include vents to enable cool air to be drawn into the projectors as well as vents to enable heated air to be exhausted from the projectors. The fans employed in conventional image display projectors are typically incapable of supplying an adequate level of airflow to remove the ever-increasing heat levels produced by the high-intensity light sources because, for instance, of high flow resistance and associated pressure drops due to the relatively small sizes of the projectors. In one respect, the amount of space available in the conventional image display projectors typically precludes the use of fans having sufficient capacity to adequately cool the light sources and lamp reflectors. In another respect, the lamp reflectors are typically constructed to have insufficient surface area to enable adequate cooling by the conventional fans.

One solution is to employ small fans that require relatively small amounts of space and that may be operated to rotate at relatively high speeds to thus create the necessary airflow to sufficiently cool the light sources and lamp reflectors. However, high-speed fans often generate too much noise and may thus be disruptive during, for instance, presentations. In addition, high-speed fans are typically associated with relatively high expense and energy usage.

SUMMARY OF THE INVENTION

According to an embodiment, the present invention pertains to a cooling system for a display projector. The display projector has a plurality of panels substantially enclosing a heat generating component. The system includes means for conducting heat from the heat generating component to at least one panel of the housing and means for dissipating the conducted heat, wherein the means for dissipating comprises at least one panel of the display projector.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
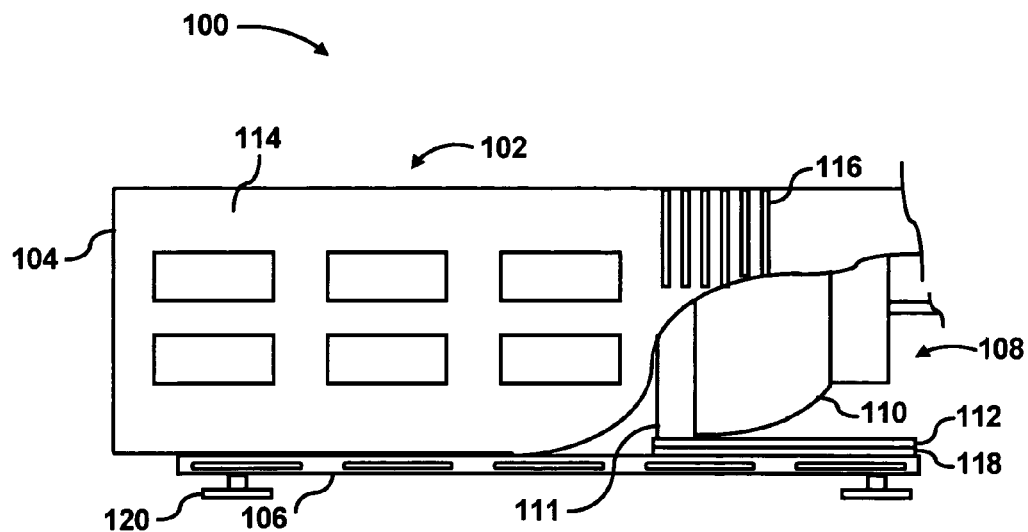
FIG. 1A illustrates a cutaway side elevational view of an image display projector according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to an embodiment of the invention, heat generated by a light source in an image display projector is conducted to and dissipated through a dissipating area, e.g., a chassis or wall of the image display projector. The heat may be conducted through use of a heat conducting means, e.g., a heat pipe, connected between, for instance, a lamp reflector that generally receives heat generated by the light source. The heat may also be conducted either from various areas around the light source to a collector that is positioned in a thermally conductive relationship with the dissipating area or through a relatively direct connection between areas around the light source to the dissipating area. The heat conducting means may be configured to enable separation thereof from the lamp reflector to thus enable replacement of the light source without necessarily requiring of the heat conducting means. In addition, the collector may also be configured to enable separation thereof from the dissipating area.

According to another embodiment of the invention, a heat collecting and conducting device may be attached to the lamp reflector to generally increase the heat conduction between the lamp reflector and the dissipating area. The heat collecting and conducting device may be attached to an area in front of the lamp reflector and may comprise a frame for supporting the lamp reflector. In addition, or alternatively, the heat collecting and conducting device may comprise a jacket attached to an exterior of the lamp reflector. The heat conducting means may be thermally attached to the heat collecting and conducting device and may be configured to conduct heat away from the lamp reflector to the dissipating area.

The dissipating area may include a relatively large surface and may be positioned near one or more walls of the image display projector housing or case. In addition, the dissipating area may comprise one or more of the walls of the image display projector. In one embodiment, the dissipating area may comprise a roll bond panel having a fluid with a low boiling temperature, e.g., water at reduced pressure, fluorinert, etc. In another embodiment, the dissipating area may comprise a panel constructed of a metallic base having chambers or openings created therein, e.g., through extrusion, casting, thixomolded magnesium, etc. The panel may include heat pipes that are integrated into the panel. For instance, the panel may include a vapor chamber, e.g., copper containing water at a reduced pressure, cast aluminum containing a fluid with a low boiling point temperature, e.g., FC-72, R-132a, etc.

Through implementation of various embodiments of the invention, heat generated by the light source in an image display projector may be conducted away from the light source and dissipated over a relatively large surface. In one regard, the temperature of the light source and components in the image display projector may be maintained at relatively low levels to, for instance, thereby increase the bulb life of the light source.

FIG. 1A illustrates a cutaway side elevational view of an image display projector 100 according to an embodiment of the invention. As illustrated in FIG. 1A, the image display projector 100 includes a housing 102. Only a side wall 104 and a bottom wall 106 of the housing 102 are visible in FIG. 1A. The housing 102 also includes a second side wall (not shown) and a rear wall (not shown) to thereby create a substantially enclosed area around an interior of the image display projector 100. Also illustrated in FIG. 1A, in a cut-away portion of the side wall 104, is a projecting device 108. The projecting device 108 generally comprises a light source (not shown), e.g., light bulb, metal halide lamp, xenon lamp, etc., housed in a lamp reflector 110. The lamp reflector 110 may be composed of a thermally conductive material produced from, e.g., metal, high-conductivity plastics, metal injection moldings, etc. In general, therefore, the thermally conductive material may be capable of conducting heat received from the light source. In addition, the projecting device 108 may comprise any reasonably suitable projecting device configured for use in known image display projectors. The projecting device 108 is also illustrated as being supported on a mounting plate 112.

The projecting device 108 may be attached to the mounting plate 112 through any reasonably suitable means that enables heat conduction from the projecting device 108 through the mounting plate 112, e.g., welding, mechanical fasteners, adhesives, etc. In addition, the mounting plate 112 may be attached to the bottom wall 106 through any reasonably suitable means that enables heat conduction from the mounting plate 112 to the bottom wall 106, e.g., welding, mechanical fasteners, adhesives, etc.

The walls, e.g., side wall 104 and bottom wall 106, of the housing 102 generally comprises cooling apparatuses that utilize the housing 102 to effect cooling by convection and radiation. One or more of the walls, e.g. side wall 104 and bottom wall 106, of the housing 102 may comprise structural roll bond panels, i.e., panels defined by two metal sheets bonded together in a manner that defines a closed fluid channel between them. Conventional roll bond panels may be found, for instance, in household refrigerators as evaporators. In addition, suitable roll bond panels may be obtained from, for instance, Showa Aluminum Corporation, of Tokyo, Japan. In the walls, e.g., side wall 104 and bottom wall 106, depicted in FIG. 1A, the fluid channels take the form of a closed labyrinth 114. A suitable low-boiling point working fluid, e.g., 3M FLOURINERT, is carried within each fluid channel. Alternatively, any reasonably suitable working fluid, e.g., hydrofluoroether, alcohol, water at a reduced pressure, etc., may also be used as the working fluid.

In FIG. 1A, the side wall 104 and the bottom wall 106 are illustrated as separate cooling components, i.e., the working fluid contained in the side wall 104 does not mix with the working fluid contained in the bottom wall 106. In this regard, the side wall 104 and the bottom wall 106 generally constitute separate roll bond panels and heat dissipation may be effectuated substantially separately therebetween.

In operation, heat generated by, for instance, the light source of the projecting device 108 is conducted via the lamp reflector 110 and the mounting plate 112 to the bottom wall 106. The heat generated by the light source may also be conducted through a frame 111 of the projecting device 108. In this regard, the frame 111 may comprise a thermally conductive device configured to support and the components of the projecting device 108. The frame 111 may be composed of any reasonably suitable that enables sufficient structural support as well as adequate heat conduction therethrough, e.g., copper, aluminum, high-conductivity carbon filled plastics, etc.

Heat may also be conducted to the side wall 104 either through the mounting plate 112 or through a separate device configured to conduct heat from the projecting device 108 to the side wall 104. In any respect, this heat is conducted directly to the working fluid carried within those portions of the wall's fluid channels 116 located immediately adjacent to the mounting plate 112, for instance. The working fluid absorbs this heat, at least in part by evaporation, and the evaporated fluid migrates throughout the labyrinth 114 of the walls, to heat the walls to a substantially uniform temperature. Optimal conduction of heat throughout each wall is achieved by configuring the channel to occupy an area of about 20 to 50% of the panel's total surface area.

The heat distributed by the working fluid throughout the walls 104 and 106 of the housing 102 is then dissipated by both convection and radiation. Dissipation of heat from the housing 102 condenses the working fluid back to liquid form, whereupon it migrates by gravity and capillary action back to the locations immediately adjacent to the mounting plate 112. A suitable wicking material, e.g., an open-cell pourous metal, sintered copper, polymer, wire mesh, fiber bundle, etc., may be disposed within the fluid channels in the labyrinth 114 to assist in wicking the working fluid in liquid form back to desired locations. In addition, fins 116 may optionally be located on the external and/or internal surfaces of the walls 104 and 106 to aid in heat dissipation. Utilizing the enclosure's external surface area in this way achieves effective cooling of the image display projector's 100 heat generating components without increasing the overall size of the image display projector 100.

The mounting plate 112 may comprise any reasonably suitable device configured to enable relatively efficient heat conduction therethrough. Examples of suitable devices may include, metal plates, high-conductivity carbon filled plastics, etc. In another example, the mounting plate 112 may also comprise a roll bond panel, i.e., a panel that is defined by a fluid channel in the form of a closed labyrinth containing a working fluid. As described hereinabove a suitable working fluid may comprise, e.g., 3M FLOURINERT, hydrofluoroether, alcohol, etc. In this example, heat generated by the projecting device 108 may be absorbed, e.g., by evaporation, by the working fluid contained in the mounting plate 112 and distributed throughout the labyrinth of the mounting plate 112 to heat the mounting plate 112 to a substantially uniform temperature.

In any respect, a thermally conductive interface material 118, e.g., thermal conductive materials available from The Bergquist Company of Chanhassen, Minn., may be interposed between any locations of the image display projector 100 where heat is to be conducted. As shown in FIG. 1A, the thermally conductive interface material 118 is illustrated as being interposed between the mounting plate 112 and the bottom wall 106. The thermally conductive interface material 118 may comprise any reasonably suitable material configured to enhance heat conduction between two or more thermally conductive components and may also be configured to accommodate for possible irregularities in the surfaces between the two or more components.

A plurality of supports 120 may be provided underneath the housing 102. The supports 120 generally enable a space between the bottom wall 106 of the housing 102 and a supporting surface, e.g., a table, floor, etc. In this regard, heat dissipation by the bottom wall 106 may generally be enhanced as air may be able to flow beneath the bottom wall 106. The supports 120 may also be configured to be extendable to, for instance, enable the image display projector 100 to be positioned at various heights and/or angles.

According to an embodiment of the invention, the housing 102 may cool the internal components of the image display projector 100 while effectively utilizing structural components of the housing 102. In this regard, it may be unnecessary to provide additional structural elements to effectuate cooling of the internal components. In addition, depending on the amount of heat being dissipated and the physical size on the image display projector 100, a supplementary fan cooling system may be eliminated. Alternatively, if a fan is needed, the size of the fan may be significantly reduced as compared with known image display projectors.

The roll bond panel configuration for the side wall 104 and the bottom wall 106 may also provide advantages separate and apart from cooling of the internal components of the image display projector 100. By way of example, portions of the channels formed in the walls 104 and 106 may be filled with noise-and/or vibration-damping materials, e.g., polyurethane. In addition, the internal and/or external surfaces may be treated to increase heat transfer or to minimize superheat formation. Moreover, the walls 104 and 106 may contain roll bond panels, with or without fluid, to stiffen the panel and the enclosure, and thereby create features to alleviate structural dynamic issues. In one respect, the roll bond structure according to embodiments of the invention provide relatively high stiffness, with relatively low mass.

Figure 1B:
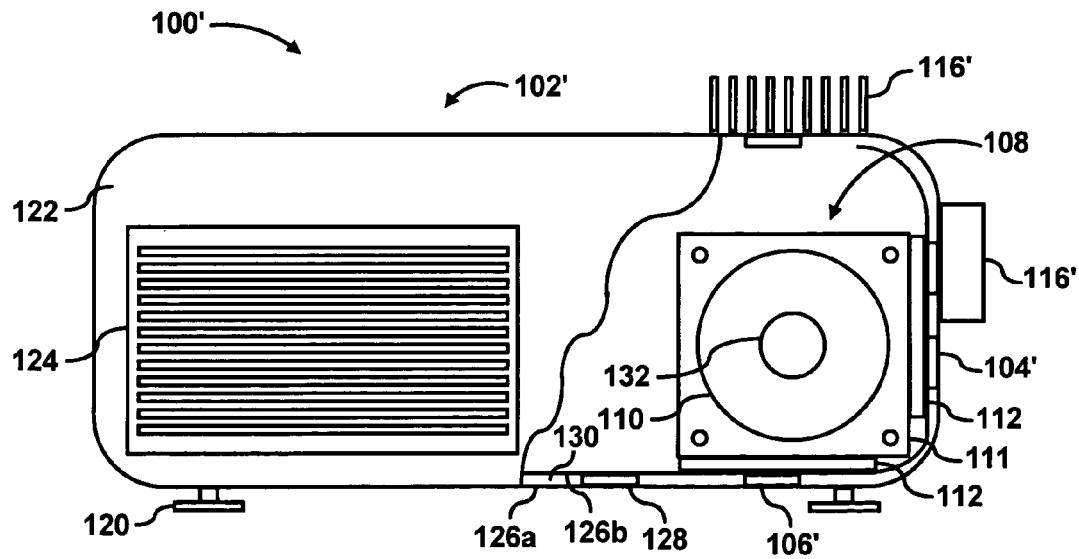
FIG. 1B illustrates a cutaway front elevational view of an image display projector according to another embodiment of the invention.

FIG. 1B illustrates a cutaway front elevational view of an image display projector 100' according to another embodiment of the invention. The image display projector 100' generally comprises a housing 102' supported on a plurality of supports 120. As illustrated in FIG. B, the housing 102' is depicted as including a front wall 122. The front wall 122 is shown as including a plurality of optional vents 124 configured to enable air to flow from an exterior of the housing 102' to an interior of the housing 102' to generally cool the components housed in the housing 102'.

As depicted in the cutaway portion of the housing 102', the walls of the housing 102' generally comprise roll bond panels, e.g., panels that are defined by fluid channels in the form of closed labyrinths containing a working fluid. The walls of the housing 102' may also comprise panels having channels or chambers created through extrusion, casting, molding, and the like. As described hereinabove, a suitable working fluid may comprise, e.g., 3M FLOURINERT, hydrofluoroether, alcohol, water at reduced temperature, etc. More particularly, the housing 102' is illustrated as comprising a pair of panels 126a and 126b spaced apart by spacing devices 128. The spacing devices 128 may comprise areas where the panels 126a and 126b are attached to each other. Alternatively, the spacing devices 128 may comprise separate elements positioned between the panels 126a and 126b.

The areas between the panels 126a and 126b and the spacing devices 128 generally comprise fluid channels 130 containing the working fluid. As described hereinabove, the fluid channels 130 generally enable the working fluid to flow to various areas between the panels 126a and 126b for dissipation of heat conducted to the working fluid.

As illustrated in FIG. 1B, the housing 102' is configured to enable working fluid to flow through the side walls 104', the bottom wall 106', and the top wall 132. In other words, the housing 102 may be formed of a single roll bond panel that is bent to form the walls 104', 106', and 132. In this regard, heat conducted into the working fluid may flow from one or more of the walls 104', 106', 132 of the housing 102' to the fluid channels 130 of other walls 104', 106', 132. According to this embodiment, the surface area over which heat is dissipated from components in the housing 102' is relatively larger, to thereby enable substantially enhanced heat dissipation through convection and radiation.

Heat dissipation may also be enhanced through inclusion of optional fins 116', shown in FIG. 1B as being provided on a side wall 104' and atop wall 132 of the housing 102'. Although the optional fins 116' are shown as being located on the side wall 104' and the top wall 132 on an exterior of the housing 102', the fins 116' may be provided at any reasonably suitable location either on or within the housing 102' to enhance heat dissipation.

In the embodiment illustrated in FIG. 1B, the projecting device 108 is illustrated as being in thermal connection to both a side wall 104' and the bottom wall 106'. The projecting device 108 is thermally connected to the bottom wall 106' and the side wall 104' via mounting plates is 112. The projecting device 108 may be attached to the mounting plates 112 through any reasonably suitable means that enables heat to be conducted from the projecting device 108 through the mounting plates 112, e.g., welding, mechanical fasteners, adhesives, etc. In addition, the mounting plates 112 may be attached to the side wall 104 and the bottom wall 106 through any reasonably suitable means that enables heat conduction from the mounting plates 112 to the walls 104 and 106, e.g., welding, mechanical fasteners, adhesives, etc. Moreover, a thermally conductive interface material (not shown) may be interposed between any locations of the image display projector 100 where heat is to be conducted, e.g., between the projecting device 108 and the mounting plates 112, between the mounting plates 112 and the walls 104 and 106.

The mounting plates 112 may comprise any reasonably suitable devices configured to enable relatively efficient heat conduction therethrough. Examples of suitable devices may include, metal plates, high-conductivity carbon filled plastics, etc. In another example, the mounting plate 112 may comprise a roll bond panel, i.e., a panel that is defined by a fluid channel in the form of a closed labyrinth containing a working fluid. As described hereinabove a suitable working fluid may comprise, e.g., 3M FLOURINERT, hydrofluoroether, alcohol, etc. In this example, heat generated by the projecting device 108 may be absorbed, e.g., by evaporation, by the working fluid contained in the mounting plates 112 and distributed throughout the labyrinth of the mounting plates 112 to heat the mounting plates 112 to a substantially uniform temperature.

The projecting device 108 may comprise a removable component in the image display projector 100, 100'. In this regard, the projecting device 108 maybe removably attached to one or more of the housing 102, 102'. Thus, for instance, the projecting device 108 may be configured such that components thereof or the whole projecting device 108 may be replaced in the event that one or more of the projecting device 108 components requires replacement, e.g., a blown light source.

In operation, heat generated by, for instance, a light source 132 of the projecting device 108 is conducted via the lamp reflector 110 and the mounting plate 112 to the walls 104 and 106.

The heat generated by the light source 132 may also be conducted through the frame 111 of the projecting device 108. In this regard, the frame 111 may comprise a thermally conductive device configured to support and the components of the projecting device 108. The frame 111 may be composed of any reasonably suitable that enables sufficient structural support as well as adequate heat conduction therethrough, e.g., copper, aluminum, high-conductivity carbon filled plastics, etc.

Figure 2:
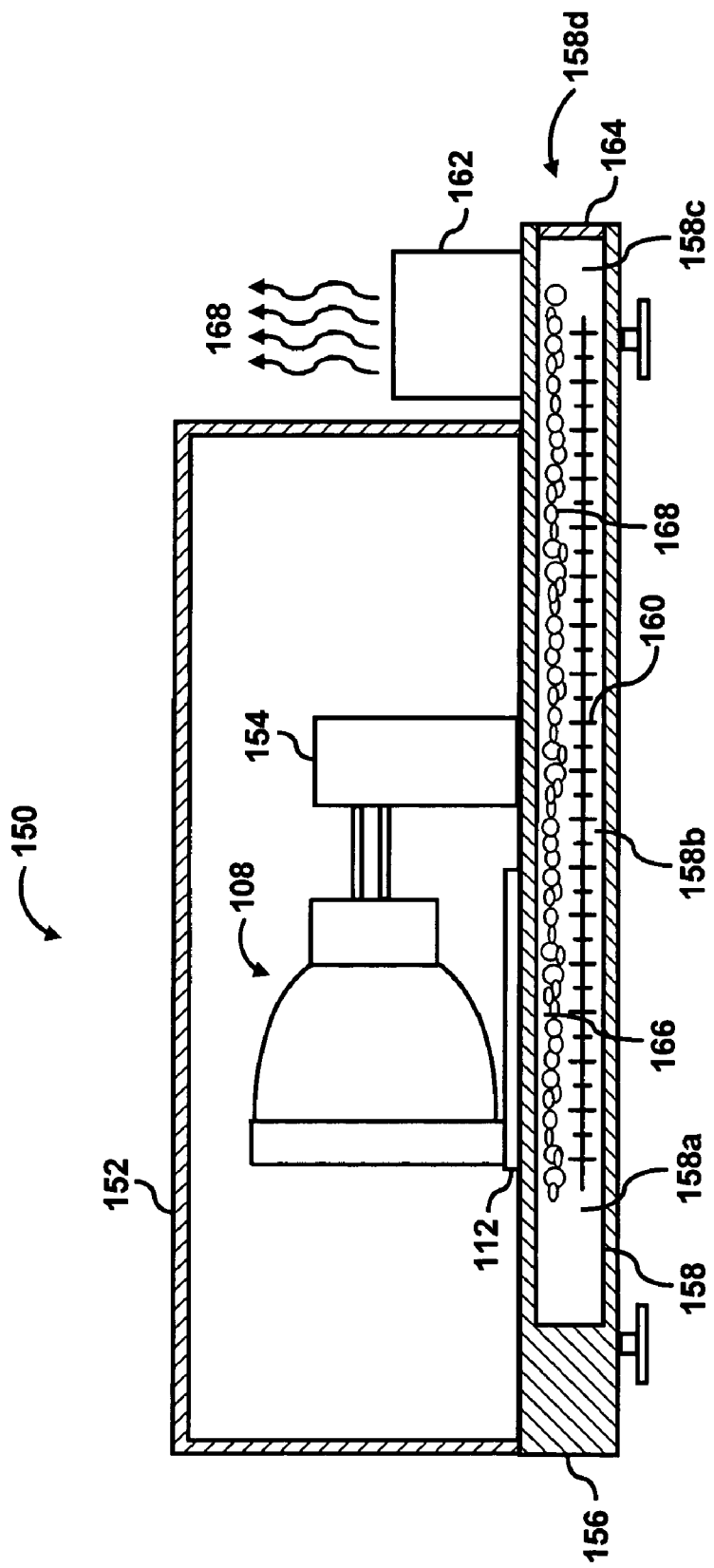
FIG. 2 illustrates a partially cross-sectional side elevational view of an image display projector according to another embodiment of the invention.

FIG. 2 illustrates a partially cross-sectional side elevational view of an image display projector 150 according to another embodiment of the invention. The image display projector 150 includes a housing 152 for substantially enclosing components of the image display projector 150, e.g., a projecting device 108, a controller 154, etc. In similar fashion to the embodiments described hereinabove, the projecting device 108 is illustrated as being supported on a mounting plate 112 configured to conduct heat generated by the projecting device 108 to a base panel 156. Heat may also be conducted from the projecting device 108 and the controller 154 substantially directly to the base panel 156. In addition, a thermally conductive interface material (not shown) may be interposed between any locations of the image display projector 100 where heat is to be conducted, e.g., between the projecting device 108 and the mounting plate 112, between the mounting plate 112 and the base panel 156, between the controller 154 and the base panel 156, etc.

The base panel 156 may be constructed of magnesium or of one of its alloys, although aluminum, plastics, or other suitable materials may be employed without departing from the scope of the invention. The base panel 156 may be cast or molded, e.g., through a THIXOMOLDING process, which is a trademark of THIFXOTECH, Inc., the Corporation having its offices at Calgary in Alberta, Canada. In addition, or alternatively, the base panel 156 may be constructed of any reasonably suitable material having chambers or channels created therein, e.g., through extrusion, casting, molding, etc. The panel may include a vapor chamber, e.g., copper containing water at a reduced pressure, cast aluminum containing a fluid with a low boiling point temperature, e.g., FC-72, R-132a, etc. The panel may also include heat pipes integrated into the chambers or channels of the panel.

As illustrated in FIG. 2, the base panel 156 generally includes a channel 158 which provides a cavity for housing a working fluid 160. The channel 158 includes an evaporator section 158*a*, an adiabatic section 158*b*, and a condenser section 158*c*. A wick 160 may optionally be provided along a lengthwise direction of the channel 158. The wick 160 may operate to generally facilitate movement of the working fluid from relatively cold locations to relatively hot locations. In addition, the wick 160 may comprise fiber bundles, mesh, sintered wicks, grooved wicks, rough surface wicks, etc. A more detailed description of wicks employable with embodiments of the invention are described in commonly assigned U.S. Pat. No. 6,418,017, the disclosure of which is hereby incorporated by reference in its entirety.

In the embodiment illustrated in FIG. 2, the channel 158 includes two ends along its length, with a channel access 158*d* located at one end of the channel 158. The channel access 158*d* is illustrated as being located at a rear of the base panel 156, under optional fins 162. The condenser section 158*c*, which is located adjacent to the channel access 158*d* may be in thermal communication with the optional fins 162. It should however, be understood that the channel access 158 may be located at any other reasonably suitable location without departing from the scope of the invention.

The channel access 158*d* is sealed with a seal 164. The seal 164 generally functions to retain working fluid 166 within a cavity of the channel 158 and to maintain a substantially air-tight seal or evacuation within the channel 158. The seal 164 may be constructed as a plug that occupies part of the channel 158 or the seal 164 may comprise a cap that covers the channel access 158*d* from outside of the channel access 158*d*. The seal 164 may be constructed of magnesium, other metals, plastic, epoxy, etc. Depending upon the material used to fabricate the seal 164, the seal 164 may be fastened to the base panel 156 braising, gluing, or other means. A relatively narrow hole, such as a "pin hole", may be provided as a feature of the seal 164 and the channel 158 may be evacuated followed by a "pinch-off" or by otherwise sealing of the relatively narrow hole to complete the sealing process.

In operation, heat generated by, for example, the projecting device 108, is conducted to and absorbed by the working fluid 166 in the evaporator section 158*a*. The working fluid 166 generally comprises a fluid having a relatively low boiling point. The working fluid 166 may therefore comprise water at a reduced pressure, alcohol, R134A, fluorinert, FC-72 (provided by the 3M Corporation). The heat received by the working fluid 166 causes the working fluid 166 in the evaporator section 158a to undergo a phase change to become a vapor 168. The vapor 168 travels through the adiabatic section 158*b* to arrive at the condenser section 158*c* where the vapor 168 undergoes a phase change to become condensate thereby liberating the absorbed heat. The liberated heat is identified as dissipated heat 168 and the dissipated heat 168 is absorbed from the condenser section 158*c* into a heat sink, which may comprise the optional fins 162. The dissipated heat 168 may radiate into the ambient air. The condensate is drawn into the wick 160 and moves along the wick 160 to return to the evaporator section 158*a* and the process may be repeated as a substantially continuous cycle.

According to an embodiment of the invention, the condenser section 158*c* of the channel 158 may be fabricated such that it is elevated with respect to the evaporator section 158*a*. Thus, the channel 158 may be oriented at an angle to the resting position of the base panel 156. This elevated position provides for gravitational forces to assist in return of the condensate of the working fluid 166.

According to another embodiment of the invention, the housing 152 may include walls, e.g., side, top, and/or rear walls, having the same or similar construction as the base panel 156. In this regard, the housing 152 may include additional areas for heat transfer and dissipation.

The base panel 156 may include some of the elements and embodiments disclosed in commonly assigned U.S. Pat. No. 6,418,017, the disclosure of which is hereby incorporated by reference in its entirety. Thus, for instance, the base panel 156 may include one or more heat pipes housed within the channel 158. As another example, the channel 158 may include a serpentine or crossed configuration as illustrated in FIGS. 8 and 9 of the U.S. Pat. No. 6,418,017, without departing from the scope of the invention.

Although embodiments of the invention have been described with respect to dissipating heat generated by a light source 108, it should be understood that embodiments of the invention may be implemented to dissipate heat generated by other components of the image display projector 100, 150. For instance, embodiments of the invention may be implemented to dissipate heat generated by motors of fans (if included), and other electronic components.

Figure 3:
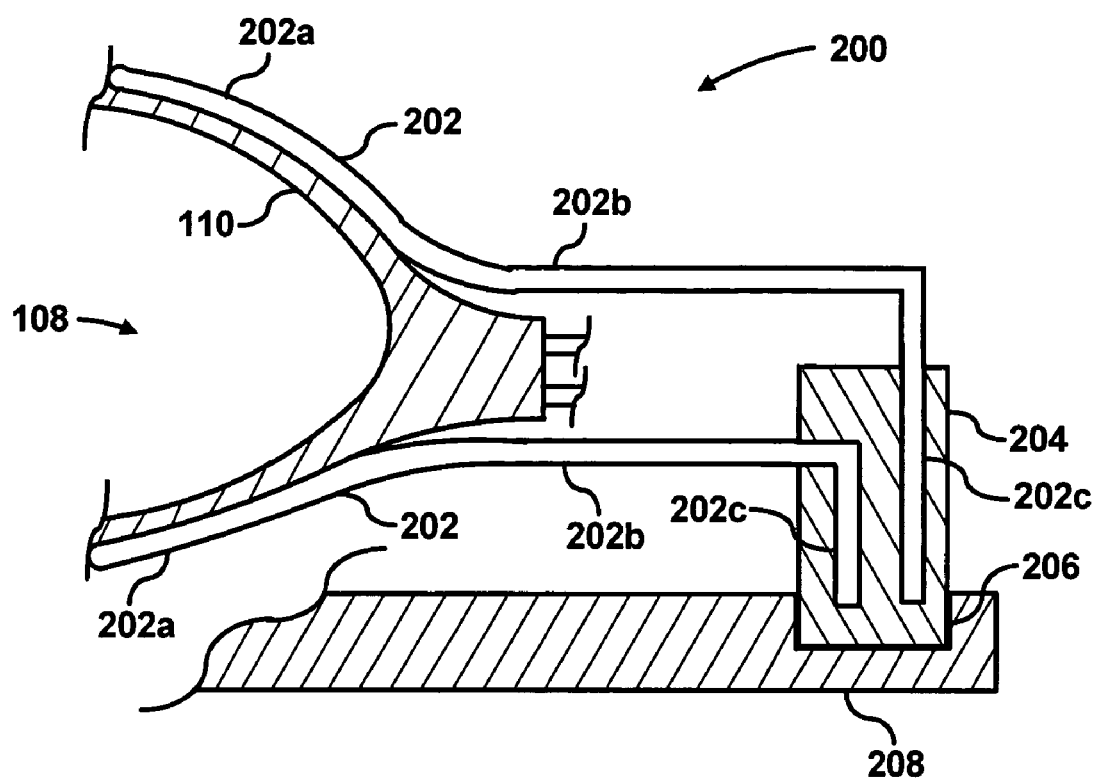
FIG. 3 depicts a partially cross-sectional view of a cooling system for an image display projector according to an embodiment of the invention.

FIG. 3 depicts a partially cross-sectional view of a cooling system 200 for an image display projector (100, 150) according to an embodiment of the invention. As shown in FIG. 3, the cooling system 200 includes a pair of heat conducting members 202 attached along one end thereof to the lamp reflector 110 of the projecting device 108. The heat conducting members 202 are also attached along an opposite end to a collector 204. The heat conducting members 202 are configured to generally enable heat produced by the projecting device 108 and conducted through the lamp reflector 110 to be conducted away from the projecting device 108 to one or more heat dissipating areas. In this regard, the heat conducting members 202 may comprise any reasonably suitable heat conducting device.

By way of example, as described hereinabove with respect to FIG. 2, the heat conducting members 202 may comprise channels (e.g., channel 158) housing a working fluid (e.g., working fluid 166). According to this example, the heat conducting members 202 may include evaporator sections 202a, adiabatic sections 202b, and condenser sections 202c. The channels may also include wicks (e.g., wick 160) for facilitating travel of the condensate of the working fluid from the condenser sections 202c back to the evaporator sections 202a. As also described hereinabove, the working fluid may comprise a fluid having a relatively low boiling point, e.g., water, alcohol, R134A, fluorinert, FC-72 (available from the 3M Corporation). In addition, the heat conducting members 202 may comprise heat pipes available from THERMACORE of Lancaster, Pa., or from FUJIKURA, of Japan.

According to another example, the heat conducting members 202 may comprise substantially solid pipes composed of, for instance, copper, aluminum, other metals, plastics, etc. Heat conducting members 202 according to this example may conduct heat directly therethrough to the collector 204.

The heat conducting members 202 may be attached to the lamp reflector 110 in any reasonably suitable manner to generally enable effective heat transfer between the lamp reflector 110 and the heat conducting members 202. In this regard, the attachment between the heat conducting members 202 and the lamp reflector 110 may comprise, for instance, welding, adhesives, mechanical fasteners, etc. In addition, or alternatively, the heat conducting members 202 may be integrally formed with the lamp reflector 110. Moreover, the heat conducting members 202 may be removably attached to the lamp reflector 110 to generally enable replacement of the projecting device 108 without requiring replacement of the cooling system 200.

The heat conducting members 202 are depicted in FIG. 3 as being inserted within and extending along a substantial height of the collector 204. In one respect, the collector 204 may be formed with channels into which the heat conducting members 202 may be inserted. In another respect, the collector may be formed around the heat conducting members 202, e.g., through molding. In addition, the collector 204 may comprise a substantially solid structure composed of metal (e.g., copper, aluminum, etc.), plastics, or other heat conducting materials. The collector 204 may also comprise a roll bond panel configured, for instance, in manners similar to those described hereinabove with respect to the mounting plate 112 (FIGS. 1A and 1B).

As a further alternative, the condenser sections 202c of the heat conducting members 202 may be attached to one or more exterior areas of the collector 204. According to this example, the condenser sections 202c may be attached to the collector 204 in manners to generally enable thermal conduction from the condenser sections 202c to the collector 204. Thus, for instance, the condenser sections 202c may be welded, adhered with adhesives, etc., to the collector 204.

As further illustrated in FIG. 3, the collector 204 is positioned in an optional recess 206 of a base panel 208 of a housing of the image display projector (100, 150). The recess 206 is considered optional because the collector 204 may be capable of conducting sufficient amounts of heat to the base panel 208 without requiring the recess 206. However, the recess 206 may be helpful in conducting heat from the collector 204 to the base panel 208 as it provides a substantially larger interface area between the collector 204 and the base panel 208. In any event, the collector 204 may be thermally attached to the base panel 208 in any reasonably suitable manner to generally enable the collector 204 to be removed from the base panel 208. For instance, the collector 204 may be frictionally held within the recess 206.

The base panel 208 may comprise the bottom wall 106 of FIG. 1A, the bottom wall 106' of FIG. 1B, or the base panel 156 of FIG. 2. In the event that the base panel 208 comprises the base panel 156 of FIG. 2, the evaporator section 158a of the channel 158 may be positioned substantially beneath the collector 204. In any regard, the collector 204 is positioned in thermal contact with the base panel 208. The thermal contact between the collector 204 and the base panel 208 may be effectuated in any reasonably suitable manner. By way of example, the thermal connection may be formed through contact between the collector 204 and the base panel 208. In this example, the collector 204 may be removably positioned on the base panel 208, which may facilitate removal and replacement of the collector 204 and/or the projecting device 108. As another example, the collector 204 may be attached to the base panel 208 via welding, adhesives, mechanical fasteners, etc.

In addition, a thermally conductive interface material (not shown), e.g., thermally conductive materials available from The Bergquist Company of Chanhassen, Minn., thermally conductive gels, etc., may be interposed between any locations of the cooling system 200 where heat is to be conducted, e.g., between the heat conducting member 202 and the lamp reflector 110, between the collector 204 and the base panel 208, etc., to thereby enhance thermal conduction between the components.

In operation, according to an embodiment of the invention, heat generated by, for example, the projecting device 108, is conducted to and absorbed by the working fluid in the evaporator sections 202a. The heat received by the working fluid causes the working fluid in the evaporator sections 202a to undergo a phase change to become a vapor. The vapor travels through the adiabatic sections 202*b* to arrive at the condenser sections 202*c* where the vapor undergoes a phase change to become condensate thereby liberating the absorbed heat. The liberated heat is identified as dissipated heat and the dissipated heat is absorbed from the condenser sections 202*c* into the collector 204. The heat in the collector 204 is dissipated into the base panel 208 where the heat may radiate into the ambient air. The condensate is drawn into the wick, if included, and moves along the wick to return to the evaporator sections 202*a* and the process may be repeated as a substantially continuous cycle.

According to an embodiment of the invention, the condenser sections 202*c* of the heat conducting members 202 may be fabricated such that they are elevated with respect to the evaporator sections 202*a*. Thus, the heat conducting members 202 may be oriented at an angle to the resting position of the base panel 208. This elevated position provides for gravitational forces to assist in return of the condensate of the working fluid to the evaporator sections 202*a*.

According to another embodiment of the invention, the collector 204 may be thermally attached to additional walls of an image display projector. In addition, or alternatively, additional collectors 204 may be provided to conduct heat to the additional walls, which may be similarly configured to the base panel 208. In this regard, heat generated by, for instance, the projecting device 108 may be dissipated over relatively larger areas.

Figure 4:
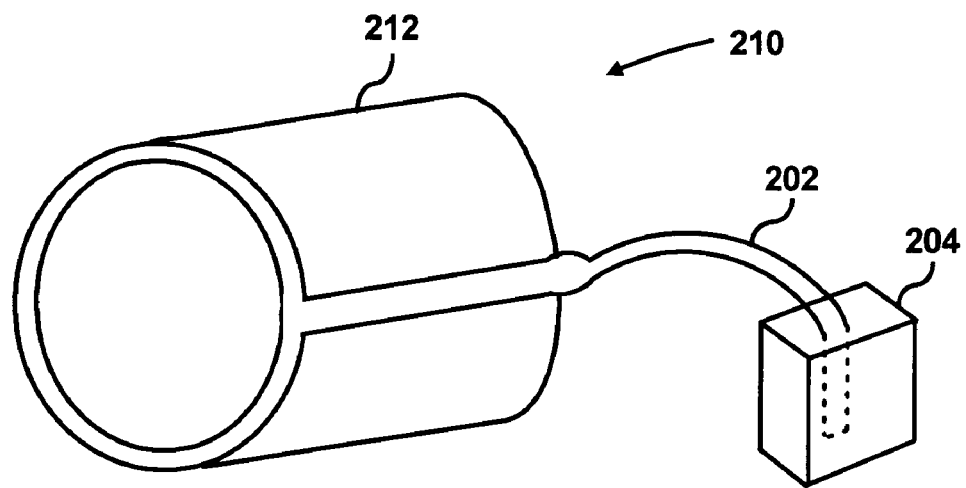
FIG. 4 illustrates a perspective view of part of a cooling system for an image display projector according to another embodiment of the invention.

FIG. 4 illustrates a perspective view of part of a cooling system 210 for an image display projector (100, 150) according to another embodiment of the invention. As illustrated in FIG. 4, the cooling system 210 includes a cover device 212, e.g., a jacket, sleeve, etc., configured for thermally conductive contact with a lamp reflector 110 (not shown). The cover device 212 may be configured such that its diameter may be varied to various sizes. In this regard, the cover device 212 may be positioned over lamp reflectors 110 having various diameters. In addition, the cover device 212 may be retro-fitted onto lamp reflectors 110 of existing image display projectors to thereby enhance cooling of the existing image display projectors.

The cover device 212 is generally composed of a heat conducting material, e.g., metal, plastic, etc., and operates to receive heat received from the lamp reflector 110, to thereby cool the projecting device 108 (not shown). A heat conducting member 202 is attached to the cover device 212 in any reasonably suitable manner to enable thermal conduction therebetween. For instance, the heat conducting member 202 may be welded, adhered, fastened with mechanical fasteners, etc., to the cover device 212. The heat collected by the cover device 212 is conducted to a heat conducting member 202, which may be of the same or similar construction as the heat conducting member 202 of FIG. 3. In addition, the heat is conducted through the heat conducting member 202 to a collector 204, which again may have the same or similar construction as the collector 204 of FIG. 3. Moreover, the heat collected by the collector 204 is conducted to a base panel 208 (not shown) in manners that are the same or similar to those described hereinabove with respect to FIG. 3. A more detailed description of the manners in which the heat conducting member 202 operates to remove heat from the cover device 212 is therefore omitted and the description provided hereinabove with respect to FIG. 3 is relied upon to provide sufficient understanding of this embodiment of the invention.

The cover device 212 is configured to be removably contacted with the lamp reflector 110. For instance, the cover device 212 may be configured to frictionally engage the lamp reflector 110 and a thermally conductive material, e.g., thermally conductive gel, may be included between the cover device 212 and the lamp reflector 110 to generally enhance thermal conduction therebetween. In one regard, through the removable contact between the cover device 212 and the lamp reflector 110, the lamp reflector and/or the projecting device 108 may be relatively easily replaced.

Figure 5:
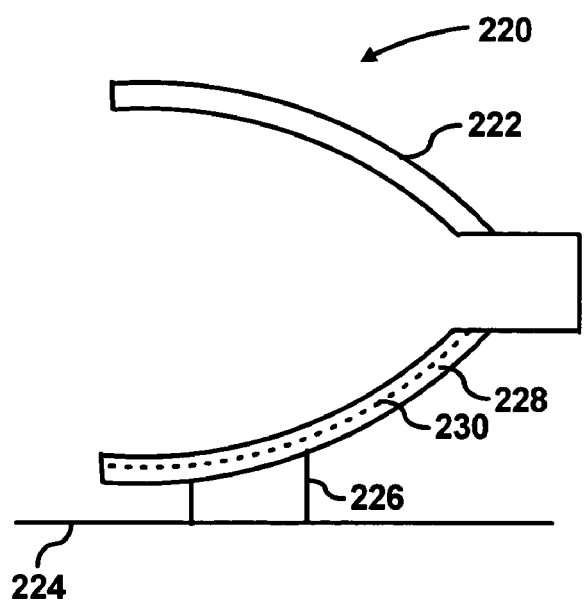
FIG. 5 illustrates a cross-sectional side view of a cooling system for an image display projector according to another embodiment of the invention.

FIG. 5 illustrates a cross-sectional side view of a cooling system 220 for an image display projector (100, 150) according to another embodiment of the invention. As illustrated in FIG. 5, the cooling system 220 includes a lamp reflector 222 connected to a base panel 224 via a thermally conductive device 226. The lamp reflector 222 according to this embodiment may be composed of metal, plastic, or other thermally conductive material. In addition, or alternatively, the lamp reflector 222 may comprise a channel 228 having a working fluid 230 with a relatively low boiling point fluid housed therein. As described hereinabove, a suitable working fluid may comprise, e.g., 3M FLOURINERT, hydrofluoroether, alcohol, water at reduced temperature, etc. In this example, heat generated by the projecting device 108 may be absorbed, e.g., by evaporation, by the working fluid contained in the lamp reflector 222.

The heat from the lamp reflector 222 may be conducted to the thermally conductive device 226, which may operate in manners similar to those described hereinabove with respect to the mounting plate 112. The thermally conductive device 226 may also comprise the same or similar construction and/or materials described hereinabove with respect to the mounting plate 112. The heat is conducted through the thermally conductive device 226 to the base panel 224, which may comprise the bottom wall 106 of FIG. 1A, the bottom wall 106' of FIG. 1B, or the base panel 156 of FIG. 2. In the event that the base panel 224 comprises the base panel 156 of FIG. 2, the evaporator section 158a of the channel 158 may be positioned substantially beneath the thermally conductive device 226. In any regard, the thermally conductive device 226 is positioned in thermal contact with the base panel 226.

Figure 6A:
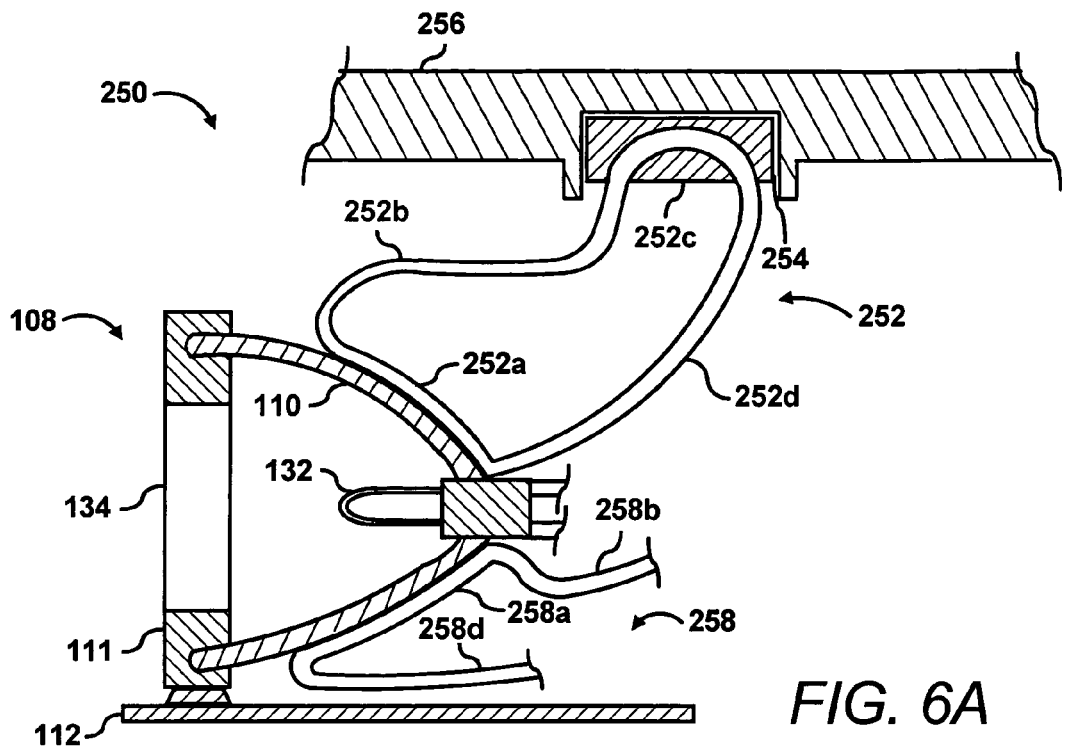
FIG. 6A illustrates a cross-sectional side view of part of a cooling system for an image display projector according to another embodiment of the invention.

FIG. 6A illustrates a cross-sectional side view of part of a cooling system 250 for an image display projector (100, 150) according to another embodiment of the invention. The image display projector is illustrated in FIG. 6 as including a projecting device 108. The projecting device 108 includes a lamp reflector 110 substantially surrounding a light source 132. The light emitted from the light source 132 is emitted through an opening 134 in the frame 111 to display an image, for instance, on a screen (not shown). The opening 134 may include, for instance, a lens or other transparent device. The projecting device 108 is also illustrated as being attached to or supported on a mounting plate 112.

The cooling system 250 includes a thermosiphon 252 arranged in a loop. The thermosiphon 252 includes an evaporator section 252*a*, an adiabatic section 252*b*, a condenser section 252*c*, and a return section 252*d*. The thermosiphon 252 may comprise a variety of configurations without departing from the scope of the invention. By way of example, the evaporator section 252*a* may comprise a relatively wide surface area, e.g., between approximately 10–100 percent of the lamp reflector 108 surface area, to generally enable heat to be transferred from a relatively large surface of the lamp reflector 108. In addition, the condenser section 252*c* may also comprise a relatively wide surface area to generally enable heat to be transferred from the condenser section 252*c* to a relatively large area of the panel 256. As another example, the evaporator section 252*a* may comprise a relatively small surface area with respect to the lamp reflector 108, for instance, if it is acceptable to remove heat from a small surface area of the lamp reflector 108.

The thermosiphon 252 contains a working fluid operable to vary between a liquid phase and vapor phase. The working fluid may comprise a liquid, such as, water at reduced pressure, or other low boiling point fluids. The thermosiphon 252 generally operates to remove heat from the lamp reflector 110 via a thermal interface between the lamp reflector 110 and the evaporator section 252 of the thermosiphon 252. More particularly, heat transferred from the lamp reflector 110 to the evaporator section 252 generally causes the working fluid contained in the evaporator section 252 to vaporize, effectively taking the latent heat of vaporization. The vapor moves along the adiabatic section 252b to the condenser section 252c, where the vapor condenses, thereby liberating the received heat. Another effect of the vapor moving along the thermosiphon 252 is that the vapor generally creates a pressure along the thermosiphon 252 to cause the working fluid contained in the condenser section 252c to be pushed along the thermosiphon 252 and back to the evaporator section 252a.

The condenser section 252c comprises a construction to generally enable thermal conduction between the thermosiphon 252 and a base 256 of the image display projector (100, 150). The condenser section 252c may therefore comprise any reasonably suitable thermally conductive material, e.g., metal, plastic, etc. The condenser section 252c is also illustrated as being positioned in an optional recess 254 of the panel 256 of the image display projector (100, 150) to generally enable thermal conduction between the condenser 252b and the panel 256. The recess 254 is considered optional because the condenser 252b may be capable of conducting sufficient amounts of heat to the panel 256 without requiring the recess 254. However, the recess 254 may be helpful in conducting heat from the condenser 252c to the panel 256 as it provides a substantially larger interface area between the condenser section 252c and the base panel 208. In addition, the condenser section 252c may be removably interfaced with the recess 254, e.g., through friction fitting, mechanical fasteners, etc., to generally facilitate removal and/or replacement of the condenser section in particular, and the cooling system 250, as a whole.

According to embodiments of the invention, the panel 256 may comprise a construction similar to the wall 204 of the housing 102 illustrated in FIG. 1A, the bottom wall 106' of the housing 102' illustrated in FIG. 1B, or the base panel 156 of the housing 152 illustrated in FIG. 2. In the event that the panel 256 comprises the construction of the base panel 156, the evaporator section 158a of the channel 158 may be positioned substantially above the condenser section 252c. In addition, a thermally conductive interface material (not shown) may be interposed between any locations of the cooling system 250 where heat is to be conducted, e.g., between the thermosiphon 252 and the lamp reflector 110, between the condenser section 252c and the panel 256, etc.

As an alternative, the panel 256 may be fabricated of any reasonably suitable heat dissipating material. For instance, the panel 256 may comprise any reasonably suitable material, e.g., metals, plastics, etc., having sufficient thermal conductive properties to generally enable heat to be dissipated into ambient air therefrom.

In any respect, during condensation of the working fluid vapor, heat is released through the condenser section 252c into the panel 256. The heat is conducted through various sections of the panel 256 to enable the heat to be dissipated into the ambient air. Fins (not shown) may optionally be attached to either the interior or the exterior of the panel 256 to facilitate heat dissipation into the ambient air. In addition, as the vapor transfers the heat to the condenser section 252c, the vapor condenses and returns via the return section 252d to the evaporator section 252a. The condensed working fluid may be returned through the return section 252d through gravitational forces acting on the working fluid since the condenser section 252c is positioned at a relatively higher location as compared to the evaporator section 252a. In addition, or alternatively, a wicking material, e.g., an open-cell pourous metal, sintered copper, polymer, wire mesh, fiber bundle, etc., may be positioned within the return section 252d to promote and enhance fluid travel to the evaporator section 252a. This process may be repeated to draw heat and cool the projecting device 108 in a substantially continuous manner.

A second thermosiphon 258 is also partially illustrated in FIG. 6 and may be employed to provide additional cooling to the projecting device 108. The second thermosiphon 258 includes an evaporator section 258a, an adiabatic section 258b, a condenser section (not shown) and a return section 258d. The condenser section of the second thermosiphon 258 may be positioned and may operate in the same or similar fashion as the thermosiphon 252. Therefore, a more detailed description of the second thermosiphon 258 is omitted. In addition, or alternatively, the condenser section of the second thermosiphon 258 may be thermally connected to a side or bottom panel of the image display projector (100, 150). In the event that the condenser section of the second thermosiphon 258 is positioned at a location relatively higher than the evaporator section 258a, the condensed working fluid may be returned through the return section 258d through gravitational forces acting on the working fluid. In addition, or alternatively, a wicking material, e.g., an open-cell pourous metal, sintered copper, polymer, wire mesh, fiber bundle, etc., may be positioned within the return section 258d to promote and enhance fluid travel to the evaporator section 258a. The wicking material may also be implemented to facilitate fluid travel from the condenser section to the evaporator section 258a if the condenser section is positioned relatively lower than the evaporator section 258a.

Although the condenser section 252c of the thermosiphon 252 is illustrated as being in thermal attachment to the panel 256 located above the projecting device 108, the condenser section 252c may be thermally attached to any panel of the image display device (100, 150) without departing from the scope of the invention. In addition, in the event that the condenser section 252c is positioned at a lower elevation as compared with the evaporator section 252a, a pump (not shown) may be employed to draw the condensed working fluid back to the evaporator section 252a.

Figure 6B:
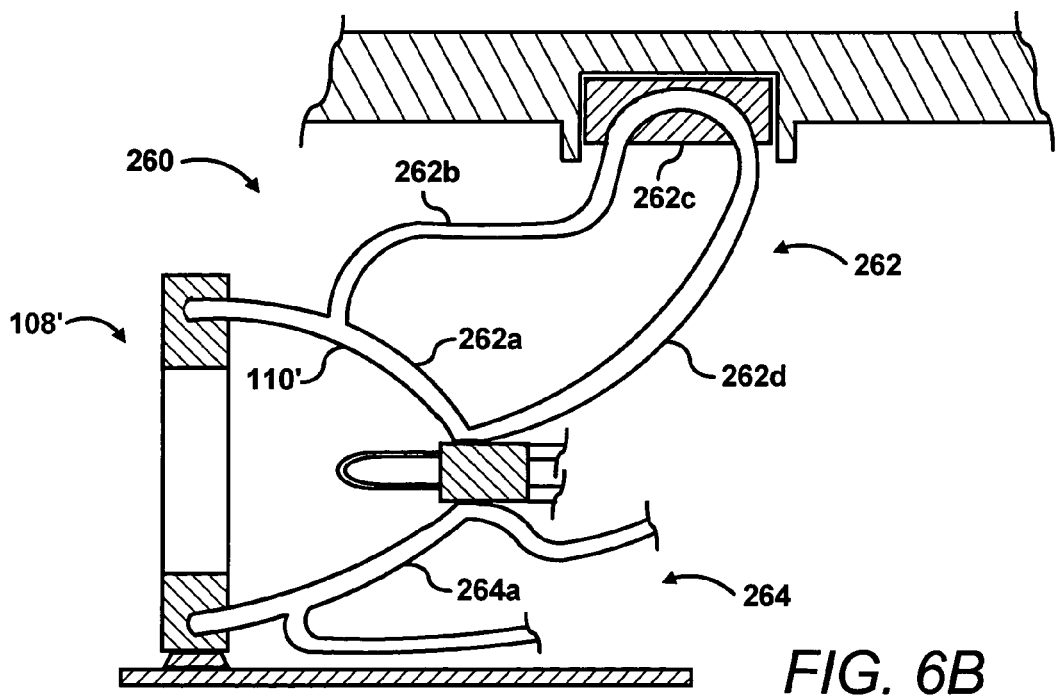
FIG. 6B illustrates a cross-sectional side view of part of a cooling system 260 for an image display projector according to yet another embodiment of the invention.

FIG. 6B illustrates a cross-sectional side view of part of a cooling system 260 for an image display projector (100, 150) according to another embodiment of the invention. The cooling system 260 of FIG. 6B comprises the same or similar elements to those described hereinabove with respect to FIG. 6A. Accordingly, only those elements that differ from FIG. 6A will be described.

As shown in FIG. 6B, the cooling system 260 is integrally formed with a projecting device 108'. More particularly, the projecting device 108' includes a lamp reflector 110' having a substantially hollow construction which forms part of a thermosiphon 262. In this regard, the thermosiphon 262 includes an evaporator section 262a integrally formed with the lamp reflector 110'. The thermosiphon 262 also includes an adiabatic section 262b, a condenser section 262c, and a return section 262d. In addition, the thermosiphon 262 generally operates in manners similar to those described hereinabove with respect to the thermosiphon 252. Therefore, working fluid may be contained in the lamp reflector 110' which operates to remove heat generated by the projecting device 110'.

Also illustrated in FIG. 6B is a second thermosiphon 264 having an evaporator section 264a integrally formed into the lamp reflector 110'. The second thermosiphon 264 generally operates in manners similar to those described hereinabove with respect to the second thermosiphon 258. The second thermosiphon 264 may be optional in projecting device 108' configurations where the thermosiphon 262 is capable of removing sufficient heat from the lamp reflector 108'.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling system for a display projector, said display projector having a housing formed of a plurality of panels around a heat generating component said cooling system comprising:
    means for conducting heat from the heat generating component to at least one panel of the housing; and
    means for dissipating the conducted heat, wherein the means for dissipating comprises the at least one panel of the display projector, and wherein the at least one panel comprises an exterior wall of the display projector.

2. A cooling system for a display projector, said display projector having at least one panel around a heat generating component, said cooling system comprising:
    means for conducting heat from the heat generating component to the at least one panel; and
    means for dissipating the conducted heat, wherein the means for dissipating the conducted heat comprises the at least one panel, and wherein the at least one panel contains a working fluid having a relatively low boiling point temperature.

3. The cooling system according to claim 1, wherein the means for dissipating comprises a chamber housing a working fluid in the at least one panel, and wherein the working fluid is operable to vaporize and condensate to thereby dissipate the conducted heat.

4. The cooling system according to claim 1, further comprising:
    means for supporting the heat generating component on at least one panel of the display projector, wherein the means for supporting the heat generating component comprises the means for conducting heat.

5. The cooling system according to claim 4, wherein the means for supporting the heat generating component comprises means for supporting the heat generating component on at least two panels of the display projector.

6. The cooling system according to claim 4, wherein the means for supporting comprises a panel containing a working fluid.

7. The cooling system according to claim 1, wherein the means for dissipating the conducted heat comprises at least two panels of the display projector, said at least two panels comprising at least two exterior walls for the display projector.

8. The cooling system according to claim 1, further comprising:
    fin means for increasing heat dissipated by the means for dissipating heat.

9. The cooling system according to claim 1, wherein the means for conducting heat comprises one or more heat conducting members, said cooling system further comprising:
    means for collecting heat conducted by the one or more heat conducting members, said means for collecting heat being configured to conduct heat to the means for dissipating heat.

10. The cooling system according to claim 9, wherein the heat generating device comprises a projecting device having a lamp reflector, and wherein the one or more heat conducting members are thermally connected to the lamp reflector.

11. The cooling system according to claim 9, wherein the heat generating device comprises a projecting device having a lamp reflector, said cooling system further comprising:
    a cover device for thermal connection to the lamp reflector, said one or more heat conducting members being thermally connected to the cover device.

12. A cooling system for a display projector, said display projector having a housing formed of a plurality of panels around a heat generating component, said cooling system comprising:
    means for conducting heat from the heat generating component to at least one panel of the housing; and
    means for dissipating the conducted heat, wherein the means for dissipating comprises the at least one panel of the display projector; and
    wherein the heat generating device comprises a projecting device having a lamp reflector, said lamp reflector comprising the means for conducting heat.

13. The cooling system according to claim 12, wherein the lamp reflector includes a channel containing a working fluid having a relatively low boiling point temperature.

14. The cooling system according to claim 1, wherein the means for conducting heat comprises a thermosiphon containing a working fluid.

15. The cooling system according to claim 14, wherein the thermosiphon comprises an evaporator section thermally connected to the heat generating component and a condenser section thermally connected to the means for dissipating the conducted heat, and wherein the working fluid is operable to receive heat from the heat generating component in the evaporator section and convey the heat to the condenser section.

16. The cooling system according to claim 12, wherein the means for conducting heat comprises a thermosiphon containing a working fluid, said lamp reflector being integrally formed with the thermosiphon and functioning as an evaporator section of the thermosiphon.

17. The cooling system according to claim 14, wherein the thermosiphon includes a wicking material for facilitating fluid travel through the thermosiphon.

18. A display projector having a housing composed of a plurality of panels, said plurality of panels forming exterior walls of the display projector, said display projector comprising:
    one or more heat generating components;
    a heat dissipating device forming at least one of the plurality of panels; and at least one heat conducting member for conducting heat from the one or more heat generating components to the heat dissipating device.

19. The display projector according to claim 18, wherein the heat dissipating device comprises a panel containing a working fluid having a relatively low boiling point temperature.

20. The display projector according to claim 18, wherein the heat dissipating device comprises a chamber housing a working fluid in the at least one panel, and wherein the working fluid is operable to vaporize and condensate to thereby dissipate the conducted heat.

21. The display projector according to claim 18, further comprising:
at least one mounting plate for supporting the one or more heat generating components on the at least one panel, said at least one mounting plate being configured to conduct heat from the one or more heat generating components to the at least one panel.

22. The display projector according to claim 21, wherein the at least one mounting plate comprises a panel containing a working fluid having a low boiling point temperature.

23. The display projector according to claim 21, further comprising:
a thermally conductive interface material positioned between the at least one mounting plate in the at least one panel for enhancing thermal conduction between the at least one mounting plate and the at least one panel.

24. The display projector according to claim 18, wherein the at least one heat conducting member is thermally attached to the one or more heat generating components, wherein the at least one heat conducting member is also thermally attached to a collector, and wherein the collector is thermally attached to the heat dissipating device.

25. The display projector according to claim 24, wherein the at least one heat generating device comprises a projecting device having a lamp reflector, and wherein the at least one heat conducting member is thermally connected to the lamp reflector.

26. The display projector according to claim 24, wherein the at least one heat generating device comprises a projecting device having a lamp reflector, said display projector further comprising:
a cover device for thermal connection to the lamp reflector, said one or more heat conducting members being thermally connected to the cover device.

27. The display projector according to claim 24, wherein the collector is removably attached to the heat dissipating device.

28. The display projector according to claim 18, wherein the at least one heat generating device comprises a projecting device having a lamp reflector, said lamp reflector comprising the at least one heat conducting member.

29. The display projector according to claim 28, wherein the lamp reflector includes a channel containing a working fluid having a relatively low boiling point temperature.

30. The display projector according to claim 18, wherein at least one heat conducting member comprises a thermosiphon.

31. The display projector according to claim 30, wherein the thermosiphon comprises an evaporator section thermally attached to at least one of the one or more heat generating components, said thermosiphon further comprising a condenser section thermally attached to the heat dissipating device.

32. The display projector according to claim 31, wherein the condenser section is further removably attached to the heat dissipating device.

33. The display projector according to claim 30, wherein at least one of the one or more heat generating components comprises a projecting device having a lamp reflector, said lamp reflector being integrally formed with the thermosiphon and functioning as an evaporator section of the thermosiphon.

34. A method for cooling one or more heat generating components in a display projector, said display projector having at least one panel forming an exterior wall of the display projector, said method comprising:
conducting heat from the one or more heat generating components to a heat dissipating device located in the at least one panel of the display projector; and
dissipating the conducted heat with the heat dissipating device to thereby cool the one or more heat generating components.

35. The method according to claim 34, wherein the one or more heat generating components comprises a projecting device having a lamp reflector, and wherein said step of conducting heat further comprises conducting heat from the lamp reflector.

36. The method according to claim 35, wherein said step of conducting heat from the lamp reflector comprises conducting heat from the lamp reflector with a heat pipe having a working fluid.

37. The method according to claim 35, wherein said step of conducting heat from the lamp reflector comprises conducting heat from the lamp reflector to a cover device, conducting heat from the cover device to a heat conducting member, conducting heat from the heat conducting member to a collector, and conducting heat from the collector to the heat dissipating device.

38. The method according to claim 35, wherein the lamp reflector comprises a channel having a working fluid, and wherein the step of conducting heat comprises vaporizing the working fluid in the lamp reflector and directing the vaporized working fluid to the heat dissipating device.

39. The method according to claim 34, wherein the one or more heat generating components are mounted on the at least one panel with a mounting plate, said step of conducting heat further comprising conducting heat through the mounting plate.

* * * * *